United States Patent
Takeda

(10) Patent No.: US 10,153,132 B2
(45) Date of Patent: Dec. 11, 2018

(54) SUBSTRATE PROCESSING APPARATUS

(71) Applicant: Hitachi Kokusai Electric Inc., Tokyo (JP)

(72) Inventor: Tsuyoshi Takeda, Toyama (JP)

(73) Assignee: Kokusai Electric Corporation, Tokyo (JP)

(*) Notice: Subject to any disclaimer, the term of this patent is extended or adjusted under 35 U.S.C. 154(b) by 0 days.

(21) Appl. No.: 15/606,560

(22) Filed: May 26, 2017

(65) Prior Publication Data
US 2017/0345617 A1    Nov. 30, 2017

(30) Foreign Application Priority Data

May 31, 2016   (JP) .................................. 2016-108774

(51) Int. Cl.
| | |
|---|---|
| *H01J 37/32* | (2006.01) |
| *C23C 16/452* | (2006.01) |
| *C23C 16/455* | (2006.01) |
| *H01L 21/687* | (2006.01) |

(52) U.S. Cl.
CPC ...... *H01J 37/32137* (2013.01); *C23C 16/452* (2013.01); *C23C 16/455* (2013.01); *C23C 16/45565* (2013.01); *H01J 37/3244* (2013.01); *H01J 37/32357* (2013.01); *H01J 37/32449* (2013.01); *H01J 37/32541* (2013.01); *H01J 37/32623* (2013.01); *H01J 37/32715* (2013.01); *H01J 37/32834* (2013.01); *H01J 37/32935* (2013.01); *H01L 21/68742* (2013.01); *H01J 2237/332* (2013.01)

(58) Field of Classification Search
None
See application file for complete search history.

(56) References Cited

U.S. PATENT DOCUMENTS

| | | | | |
|---|---|---|---|---|
| 2001/0006093 | A1* | 7/2001 | Tabuchi | C23C 16/24 |
| | | | | 118/723 E |
| 2008/0314523 | A1 | 12/2008 | Iizuka | |
| 2010/0025371 | A1 | 2/2010 | Cho et al. | |
| 2011/0039402 | A1* | 2/2011 | Yamazaki | C23C 16/24 |
| | | | | 257/E21.119 |
| 2012/0115314 | A1* | 5/2012 | Sakamoto | C23C 16/24 |
| | | | | 118/723 E |

(Continued)

FOREIGN PATENT DOCUMENTS

| | | |
|---|---|---|
| CN | 105103269 A | 11/2015 |
| JP | 05-063604 A | 3/1993 |

(Continued)

OTHER PUBLICATIONS

Office Action in corresponding Japanese Patent Application No. 2016-108774, dated Jul. 26, 2017, with English translation.

(Continued)

*Primary Examiner* — Binu Thomas
(74) *Attorney, Agent, or Firm* — Edell, Shapiro & Finnan, LLC

(57) ABSTRACT

Described herein is a technique capable of suppressing the effects of plasma on a film or a structure formed on a substrate. According to the technique, electrode for generating plasma includes protrusion provided with gas flow path inserted in holes of showerhead to uniformly supply gas in plasma state toward a substrate.

17 Claims, 10 Drawing Sheets

(56) References Cited

U.S. PATENT DOCUMENTS

2015/0060265 A1* 3/2015 Cho ................. H01J 37/32018
                                                    204/192.32
2015/0303037 A1* 10/2015 Ha ....................... C23C 16/452
                                                    118/723 R

FOREIGN PATENT DOCUMENTS

| JP | 09-134800 A    |   | 5/1997 |
|----|----------------|---|--------|
| JP | 2001-155997 A  |   | 6/2001 |
| JP | 2010-34532 A   |   | 2/2010 |
| JP | 4900956 B2     |   | 1/2012 |
| JP | 2013-125761 A  |   | 6/2013 |
| JP | 2013125761 A   | * | 6/2013 |
| JP | 2015-092533 A  |   | 5/2015 |

OTHER PUBLICATIONS

Office Action in corresponding Chinese Patent Application No. 201710368871.2, with English translation.
Office Action in corresponding Korean Patent Application No. 10-2017-0062087, dated Jun. 8, 2018, with English translation.
Office Action in corresponding Taiwan Patent Application No. 106117415, dated Jun. 27, 2018, with English translation.

* cited by examiner

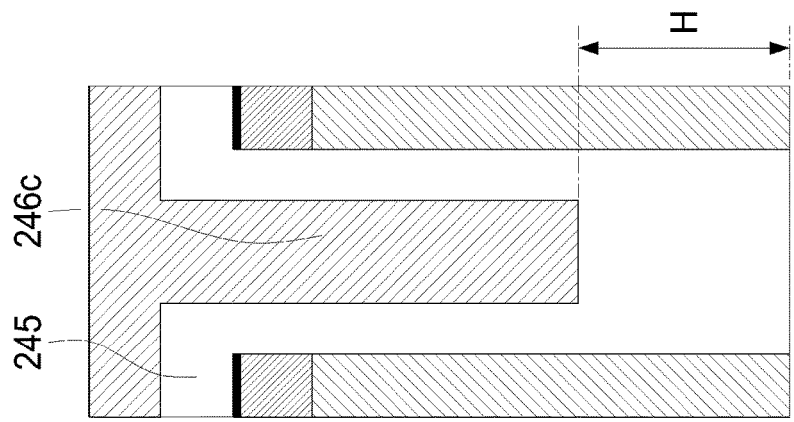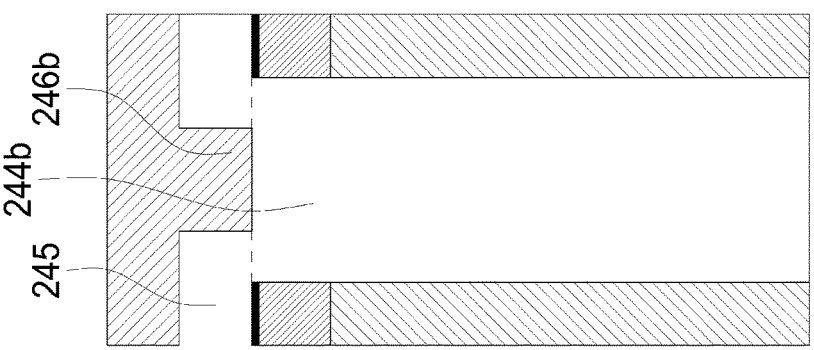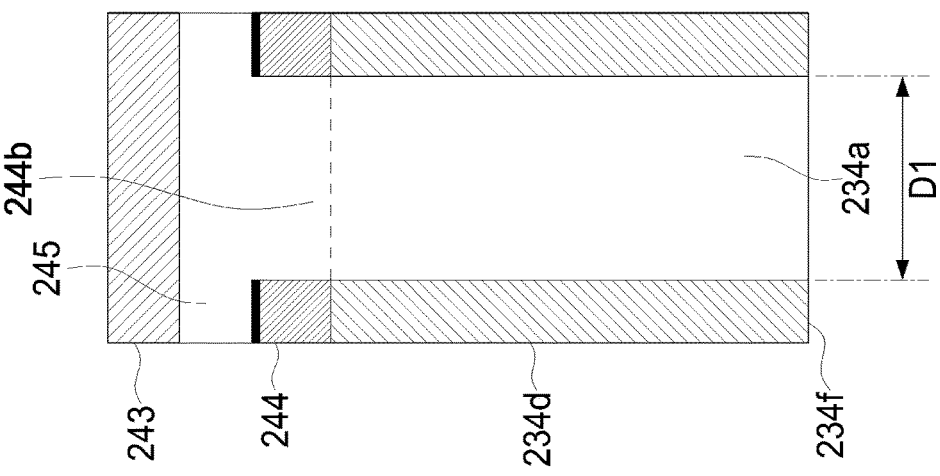

SUBSTRATE PROCESSING APPARATUS

CROSS REFERENCE TO RELATED APPLICATIONS

This application claims foreign priority under 35 U.S.C. § 119(a)-(d) to Japanese Application No. JP 2016-108774 filed on May 31, 2016, the entire contents of which are hereby incorporated by reference.

TECHNICAL FIELD

The present disclosure relates to a substrate processing apparatus.

BACKGROUND

Due to high integration density of semiconductor devices such as large scale integrated circuits (LSIs), dynamic random access memories (DRAMs) and flash memories, the miniaturization of circuit pattern or the structure formed in the manufacturing process of the semiconductor device is in progress. In order to realize the miniaturization in the manufacturing process of the semiconductor device, processes using plasma are performed.

In the processes using plasma, ions present in the plasma may affect the film or structure formed on the substrate.

SUMMARY

Described herein is a technique capable of suppressing the effects of plasma on a film or a structure formed on a substrate.

According to one aspect of the technique described herein, a substrate processing apparatus may include: a process chamber where a substrate is processed; a substrate support unit configured to support the substrate; a gas supply unit configured to supply a gas to the substrate via a buffer chamber; an electrode including a gas flow channel in communication with the buffer chamber, wherein the electrode is disposed under the buffer chamber; an insulating plate including a first hole provided adjacent to the gas flow channel, wherein the insulating plate is disposed under the electrode; a dispersion unit including a second hole disposed adjacent to the first hole to be in communication with the gas flow channel, wherein the dispersion unit is disposed under the insulating plate; a power supply unit electrically connected to the electrode; and a control unit configured to: control the gas supply unit to supply the gas into a plasma generation region in the second hole at a downstream side of the insulating plate; and control the power supply unit to supply electrical power to the electrode to generate a plasma of the gas in the plasma generation region.

BRIEF DESCRIPTION OF THE DRAWINGS

FIGS. 10A through 10C schematically illustrate a configuration of an electrode member according to another embodiment.

DETAILED DESCRIPTION

Embodiments will be described below.

Embodiment

An embodiment will be described with reference to the drawings.

(1) Configuration of Substrate Processing Apparatus

First, a substrate processing apparatus according to an embodiment will be described.

Figure 1:
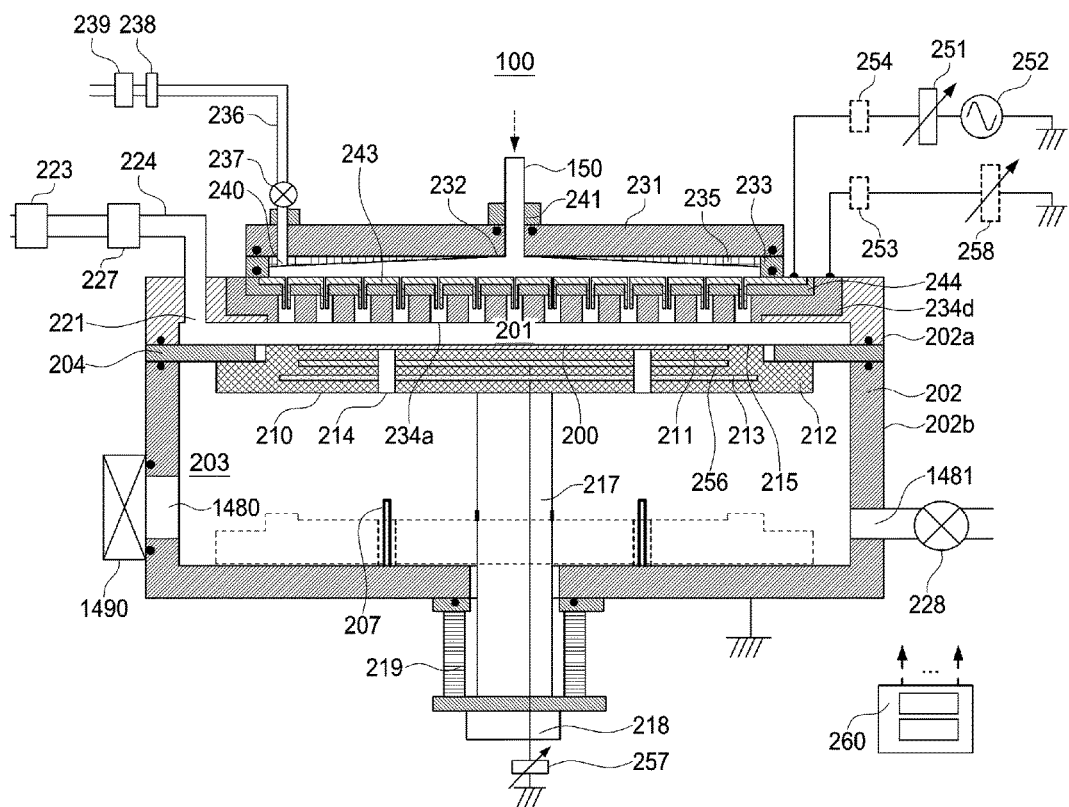
FIG. 1 schematically illustrates a configuration of a substrate processing apparatus according to an embodiment described herein.

A substrate processing apparatus 100 according to the embodiment will be described. The substrate processing apparatus 100 includes an insulating film forming unit. As shown in FIG. 1, the substrate processing apparatus 100 includes, for example, a single wafer substrate processing apparatus.

As shown in FIG. 1, the substrate processing apparatus 100 includes a process vessel 202. For example, the process vessel 202 is a flat and sealed vessel having a circular horizontal cross-section. The process vessel 202 is made of a metal material such as aluminum (Al) and stainless steel (SUS) or quartz. A processing space (process chamber) 201 where a wafer 200 such as a silicon wafer is processed and a transfer space (transfer chamber) 203 are provided in the process vessel 202. The process vessel 202 includes an upper vessel 202a and a lower vessel 202b. A partition plate 204 is provided between the upper vessel 202a and the lower vessel 202b. A space above the partition plate 204 surrounded by the upper vessel 202a is referred to as the process chamber 201 and a space under the partition plate surrounded by the lower vessel 202b and is referred to as the transfer chamber 203.

A substrate loading/unloading port 1480 is provided on a side surface of the lower vessel 202b adjacent to a gate valve 1490. The wafer 200 is moved between a substrate transfer chamber (not shown) and the transfer chamber 203 through the substrate loading/unloading port 1480. Lift pins 207 are provided at the bottom of the lower vessel 202b. The lower vessel 202b is electrically grounded.

A substrate support unit 210 is provided in the process chamber 201 to support the wafer 200. The substrate support unit 210 includes a substrate support 212 having a substrate placing surface 211 on which the wafer 200 is placed and a heater 213 serving as a heating unit. Holes 214 through which the lift pins 207 penetrate are provided in the substrate support 212 at positions corresponding to the lift pins 207. A bias electrode 256 for applying a bias to the wafer 200 or the process chamber 201 may be provided in the substrate support 212. The bias electrode 256 is connected to a bias adjusting unit 257. The bias adjusting unit 257 is configured to adjust the bias.

The substrate support 212 is supported by a shaft 217. The shaft 217 penetrates the bottom of the process vessel 202 and is connected to an elevating mechanism 218 at the outside of the process vessel 202. The wafer 200 placed on the substrate placing surface 211 may be elevated and lowered by elevating and lowering an elevating the shaft 217 and the substrate support 212 by the elevating mechanism 218. A bellows 219 covers the lower portion of the shaft 217 to maintain the inside of the process chamber 201 airtight.

When the wafer 200 is transported, the substrate support 212 is lowered until a wafer transfer position denoted by the dashed line in FIG. 1 is reached. When the wafer 200 is processed, the substrate support 212 is elevated until a wafer processing position shown in FIG. 1 is reached.

Specifically, when the substrate support 212 is lowered to the wafer transfer position, the upper ends of the lift pins 207 protrude from the upper surface of the substrate placing surface 211, and the lift pins 207 supports the wafer 200 from thereunder. When the substrate support 212 is elevated to the wafer processing position, the lift pins 207 are retracted from the upper surface of the substrate placing surface 211 and the substrate placing surface 211 supports the wafer 200 from thereunder. Preferably, the lift pins 207 are made of a material such as quartz and alumina since the lift pins 207 are in direct contact with the wafer 200.

Exhaust System

The first exhaust system (exhaust line) includes an exhaust port 221, an exhaust pipe 224 and a pressure controller 227. The first exhaust system may further include a vacuum pump 223. The exhaust port 221, which is a first exhaust unit for exhausting an inner atmosphere of the process chamber 201, is connected to the surface of the inner wall of the process chamber 201 (the upper vessel 202a). The exhaust pipe 224 is connected to the exhaust port 221. The pressure controller 227 such as an APC (Automatic Pressure Controller) and the vacuum pump 223 that control the inner pressure of the process chamber 201 are connected in-line to the exhaust pipe 224 in order. An exhaust pipe 1481 for exhausting an inner atmosphere of the transfer chamber 203 is connected to the surface of the inner wall of the transfer chamber 203. A pressure controller 228 is installed in the exhaust pipe 1481 to control the inner pressure of the transfer chamber 203. The inner atmosphere of the transfer chamber 203 may be exhausted through the exhaust pipe 1481 by the pressure controller 228. The inner atmosphere of the process chamber 201 may also be exhausted through the transfer chamber 203.

Gas Introduction Port

A shower head 234 is installed at the upper portion of the process chamber 201. A gas introduction port 241 for supplying various gases into the process chamber 201 is installed at the ceiling of the shower head 234. A detailed configuration of each gas supply unit connected to the gas introduction port 241 will be described later.

Gas Dispersion Unit

The showerhead 234, which is a gas dispersion unit, includes a buffer chamber 232 (first dispersion unit) and a dispersion plate 234d. The dispersion plate 234d is a dispersion unit having second holes 234a. The shower head 234 is provided between the gas introduction port 241 and the process chamber 201. A first gas supplied through the gas introduction port 241 is supplied to the buffer chamber 232 of the shower head 234 and is then supplied to the process chamber 201 via the second holes 234a.

An excitation unit includes an electrode 243, an insulating plate 244 and second hole 234a. The electrode 243 is provided in the buffer chamber 232 of the shower head 234. The electrode 243 is made of a conductive metal. The electrode 243 is part of the excitation unit for exciting the gas. When a cover 231 is made of a conductive material an insulating block 233 is provided between the cover 231 and the electrode 243. The insulating block 233 electrically insulates the cover 231 from the electrode 243. The dispersion plate 234d is electrically grounded 234a. A bias control unit 258 may be provided between the dispersion plate 234d and the electrical ground. An insulating plate 244 may be provided between the dispersion plate 234d and the electrode 243. The insulating plate 244 electrically insulates the electrode 243 from the dispersion plate 234d.

A matching unit 251 and a high frequency power supply 252 are connected to the electrode 243 which is part of the excitation unit. The matching unit 251 and the high frequency power supply 252 may supply an electromagnetic wave (high frequency wave or microwave) to the electrode 243. When the electromagnetic wave is supplied to the electrode 243, the gas supplied through the second hole 234a may be activated. Although the electromagnetic wave is supplied in this embodiment, a plasma may be generated by supplying DC power between the electrode 243 and the dispersion plate 234d.

FIGS. 2A to 2D are enlarged views of one of the second holes 234a and its surroundings shown in FIG. 1. The electrode 243, the insulating plate 244 and the second hole 234a may be arranged as shown in FIGS. 2A through 2D.

Figure 2:
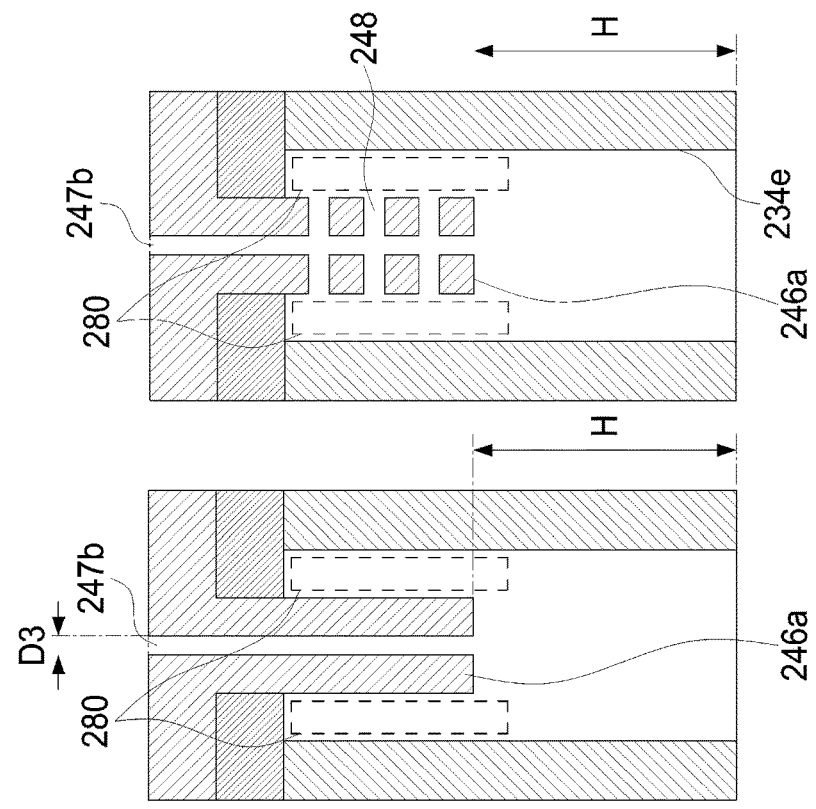
FIGS. 2A through 2D schematically illustrate a structure of an electrode member according to the embodiment.

As shown in FIG. 2A, a gas flow channel structure 247a includes a gas flow channel 243a and a first hole 24a. The gas flow channel structure 247a is configured to supply gas from the buffer chamber 232 to the second hole 234a. The gas flow channel 243a, which is provided in the electrode 243, has a diameter D2 that is smaller than a diameter D1 of the second hole 234a. The insulating plate 244 provided with the first hole 244a having the diameter D2 is mounted on the dispersion plate 234d. A plasma generation region 280, in which a plasma of a gas is generated, is provided in the second hole 234a. Since the plasma generation region 280 is provided in each second hole 234a, an active species may be supplied to the entire surface of the wafer 200. Therefore, the processing uniformity of the surface of the wafer 200 may be improved. Since the inner wall 234a of the second hole 234a provided at the dispersion plate 234d is electrically grounded, the ion component generated in the second hole 234a may be captured at the inner wall 234e. Thus, the ion component may be suppressed from reaching the wafer 200. Since the lower end 234f of the inner wall 234e, which faces the wafer 200, is electrically at ground level, the ion component is pulled toward the lower end 234f even when the ion component is ejected from the second hole 234a. As a result, the amount of the ion component reaching the wafer 200 may be reduced. By reducing the amount of the ion component reaching the wafer 200, the step coverage of the process for the wafer may be improved and the damage caused by ions may be reduced.

Since the diameter D2 of the gas flow channel 243a is smaller than the diameter D1 of the second hole 234a, the flow velocity of the gas supplied to the gas flow channel 243a may be maintained until the second hole 234a. The flow velocity of the gas may also be maintained in the second hole 234a or in the interior of the process chamber 201. Preferably, the diameter D2 of the gas flow channel 243a is in a range such that plasma is not generated, and the diameter D1 of the second hole 234a is in a range such that plasma is generated. Each diameter is selected according to Paschen's law. Preferably, the length of the second hole 234a is in a range such that plasma is not generated at the lower end thereof.

The structure shown in FIG. 2B will be described in detail. The electrode 243 includes a protrusion 246 having an outer diameter equal to the diameter of the first hole 244a. A portion of the gas flow channel 247b through which the gas flows is provided in the protrusion 246. The surface area of the gas flow channel 247b shown in FIG. 2B is larger than the surface area of the gas flow channel structure 247a shown in FIG. 2A. In the structure shown in FIG. 2B, since the amount of time for the gas to pass through the gas flow channel 247b is longer, the amount of generated active species may be increased.

The structure shown in FIG. 2C differs from the structure shown in FIG. 2B in that the lower end of the protrusion 246a is disposed inside the second hole 234a. The detailed description is given below. The electrode 243 includes the gas flow channel 247b and the protrusion 246a having the outer diameter equal to the diameter of the first hole 244a. As shown in FIGS. 2C and 2D, the lower end of the protrusion 246a is higher than the lower end 234f of the second hole 234a by height H. When the height H is greater than the diameter D1 of the second hole 234a, the surface area of the gas flow channel 247b increases, and the amount of the active species generated in the second hole 234a may be increased. Since the amount of the ion component generated in second hole 234a and captured by the electrically grounded inner wall 234e is greater then the amount of the ion component ejected through the second hole 234a, the ion component is suppressed from reaching the wafer 200.

Figure 3:
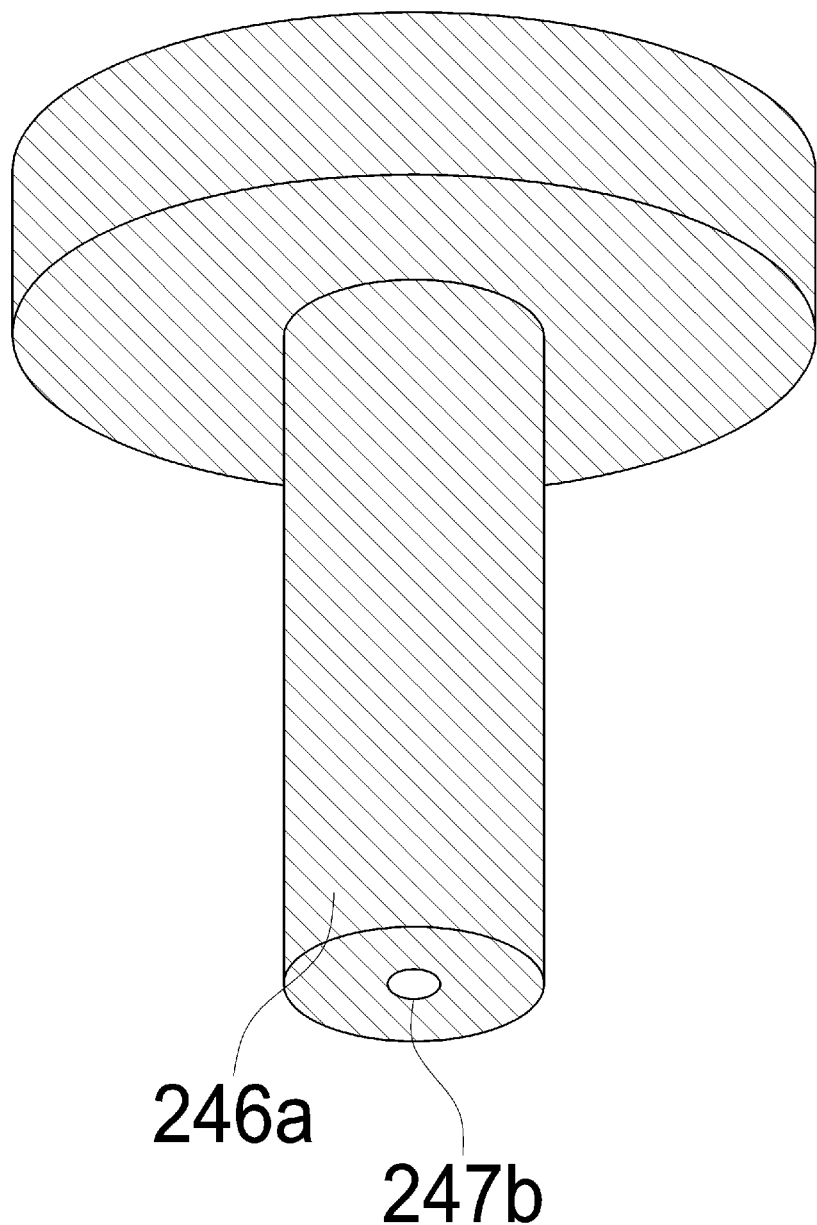
FIG. 3 schematically shows the structure of the electrode member according to the embodiment.

The protrusions 246 and 246a shown in FIG. 2B and FIG. 2C will be described with reference to FIG. 3. As shown in FIG. 3, the protrusion 246a is cylindrical. According the embodiment, the diameters of the protrusions 246 and 246a are the same as those of first hole 244a provided at the insulating plate 244. When the diameters of the protrusions 246 and 246a are the same as those of the first hole 244a, the misalignment of the protrusions 246 and 246a with respect to the center of the second hole 234a may be suppressed. As a result, plasma may be formed at predetermined location, and the processing uniformity at the surface of the wafer 200 may be improved.

The lower end of the protrusions 246 and 246a may be hemispherical or spherical. For example, when the lower end of the protrusions 246 and 246a is hemispherical, Electric field is not concentrated at the lower end of protrusions 246 and 246a compared to a sharp-pointed lower end of protrusions 246 and 246a. As a result, an abnormal discharge in the second hole 234a may be suppressed.

FIG. 2D illustrates a structure further provided with third holes (second gas flow channel) 248 configured to supply the gas from the gas flow channel 247b toward the inner wall 234e compared to the structure shown in FIG. 2C. The third holes(second gas flow channel) 248 are provided at the side surface of protrusion 246a facing the inner wall 243e. In the structure shown in FIG. 2D, the active species generated in the portion of the second hole 234a near the insulating plate 244 moves toward the process chamber 201 without remaining near the insulating plate 244. As a result, the efficiency of processing the wafer may be improved.

The components that are in direct contact with the gas such as electrode 243, inner wall 234e and the lower end 234f of the inner wall 234e which faces the wafer 200 may be coated such that the scattering of the materials constituting the components is suppressed. For example, the components may be coated by insulating materials such as an oxide. Specifically, when the components are made of aluminum, the components may be coated by aluminum oxide.

A gas guide 235 may be installed in the buffer chamber 232. The gas guide 235 has a conical shape having the gas introduction hole 241 as a center with a diameter increasing toward the outer periphery of the wafer 200. The lower end of the gas guide 235 extends further outward than the end of the region where the second hole 234a is provided. By installing the gas guide 235, the gas may be uniformly supplied to each second hole 234a, and the active species may be supplied to the entire surface of the wafer 200 in uniform manner.

A shower head exhaust port 240, which is second exhaust unit, for exhausting the inner atmosphere of the buffer chamber 232 is provided at an upper surface of an outer circumference portion of the buffer chamber 232. A second exhaust pipe 236 is connected to the shower head exhaust port 240, and a valve 237 is provided at the second exhaust pipe 236. A pressure controller 238 and a vacuum pump 239 are sequentially provided at the second exhaust pipe 236 in order. The second exhaust unit exhaust line includes the shower head exhaust port 240, the valve 237 and the second exhaust pipe 236. Instead of the vacuum pump 239, the exhaust pipe 236 may be directly connected to a downstream side of the exhaust pipe 224. By exhausting the inner atmosphere of the buffer chamber 232 using the second exhaust unit, the time necessary for exhausting the inner atmosphere of the buffer chamber 232 may be reduced.

Figure 4:
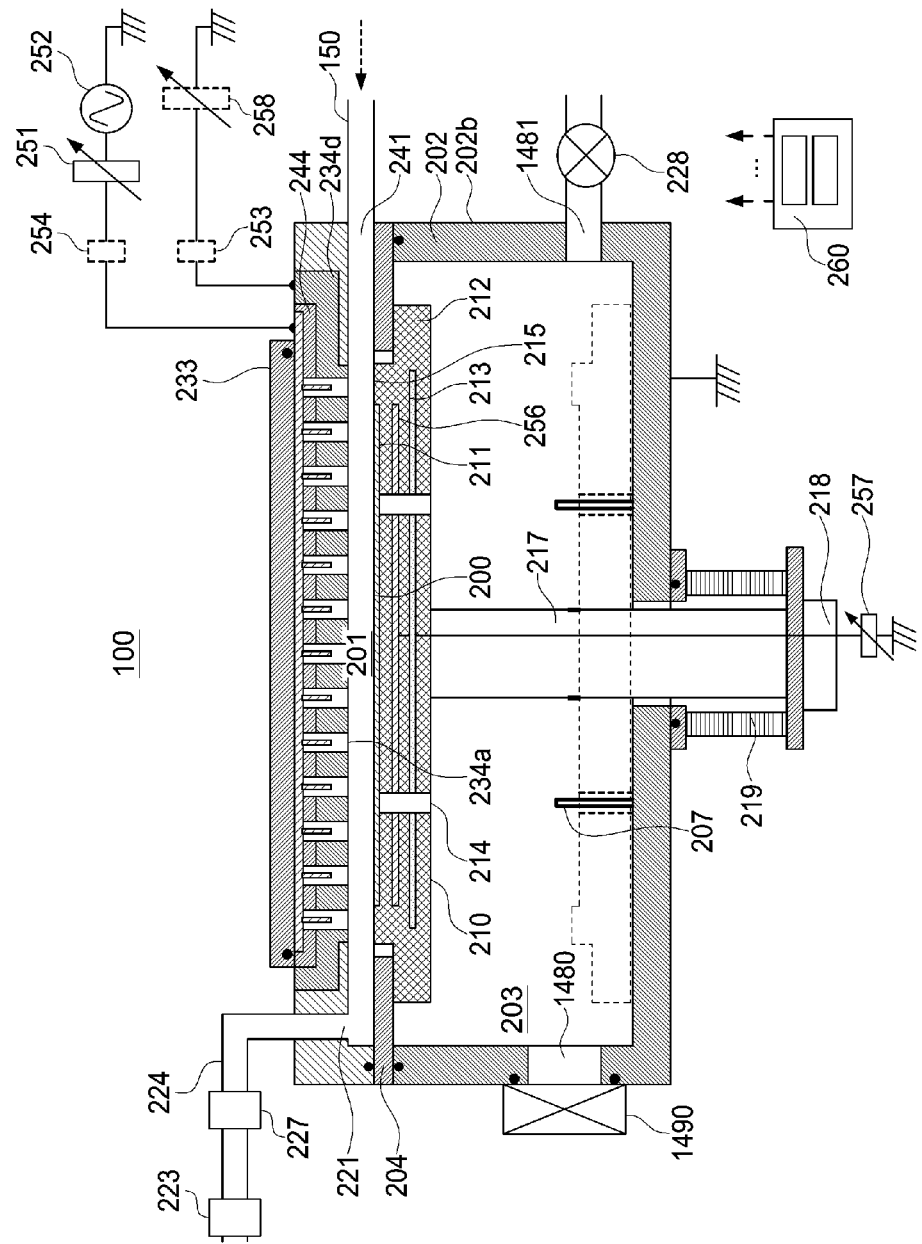
FIG. 4 schematically illustrates a structure of a substrate processing apparatus according to another embodiment.

While a configuration wherein the gas is supplied to the wafer 200 via the shower head 234 is described above, the embodiment is not limited thereto. For example, as shown in FIG. 4, the gas may be supplied to the wafer laterally. Specifically, the gas introduction hole 241 may be provided at the sidewall of the process chamber 201 and a gas supply pipe 150 may be connected to the gas introduction hole 241. Since plasma may be formed in the second hole 234a, the active species may be supplied to the wafer 200.

Gas Supply System

The gas supply pipe 150 is connected to the gas introduction hole 241. A first gas, a second gas and a purge gas, which are described later, are supplied through the gas supply pipe 150.

Figure 5:
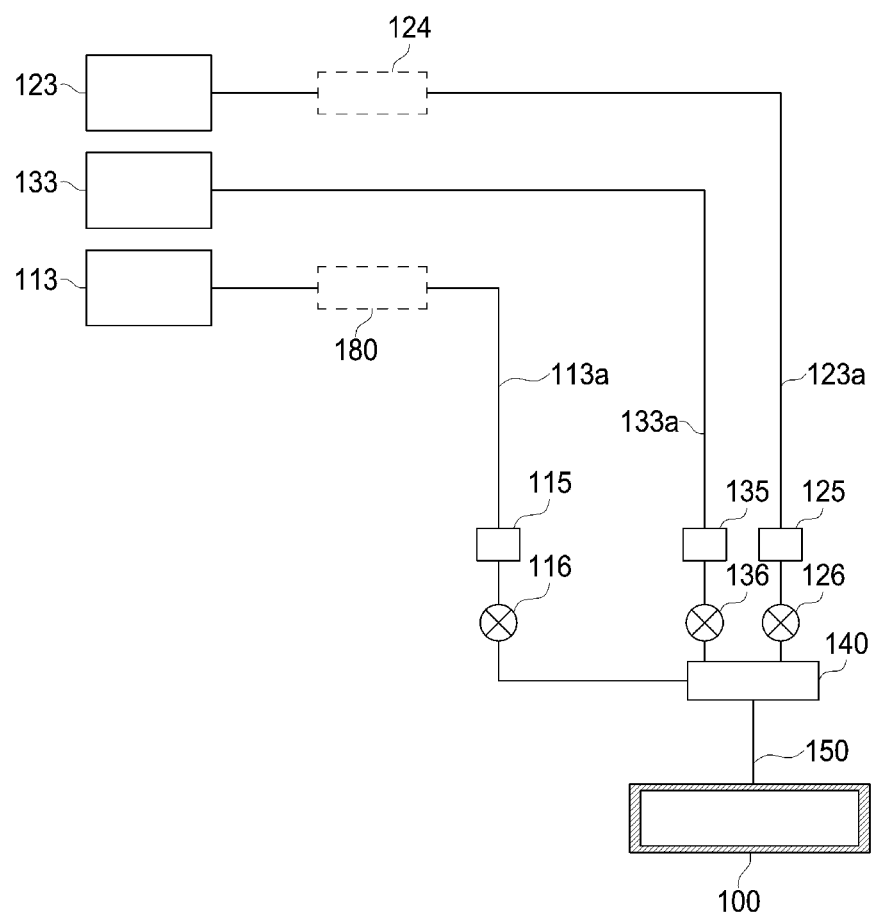
FIG. 5 schematically illustrates a configuration of a gas supply system according to the embodiment.

FIG. 5 schematically illustrates the configurations of a first gas supply unit, a second gas supply unit and a purge gas supply unit.

As shown in FIG. 5, a gas supply pipe aggregation unit 140 is connected to the gas supply pipe 150. A first gas (process gas) supply pipe 113a, a purge gas supply pipe 133a and a second gas (process gas) supply pipe 123a are connected to the gas supply pipe aggregation unit 140.

First Gas Supply Unit

The first gas supply unit includes the first gas supply pipe 113a, a mass flow controller (MFC) 115 and a valve 116. The first gas supply unit may further include a first gas supply source 113 connected to the first gas supply pipe 113a. When the source of the process gas source is liquid or solid, the first gas supply unit may further include an evaporator 180.

Second Gas Supply Unit

The second gas supply unit includes the second gas supply pipe 123a, an MFC 125 and a valve 126. The second gas supply unit may further include a second gas supply source 123 connected to the second gas supply pipe 123a. The second gas supply unit may further include a remote plasma unit (RPU) 124 configured to activate the second gas.

Purge Gas Supply Unit

The purge gas supply unit includes the purge gas supply pipe 133a, an MFC 135 and a valve 136. The purge gas supply unit may further include a purge gas supply source 133 connected to the purge gas supply pipe 133a.

Control Unit

As shown in FIG. 1, the substrate processing apparatus 100 includes a controller 260 configured to control components thereof.

Figure 6:
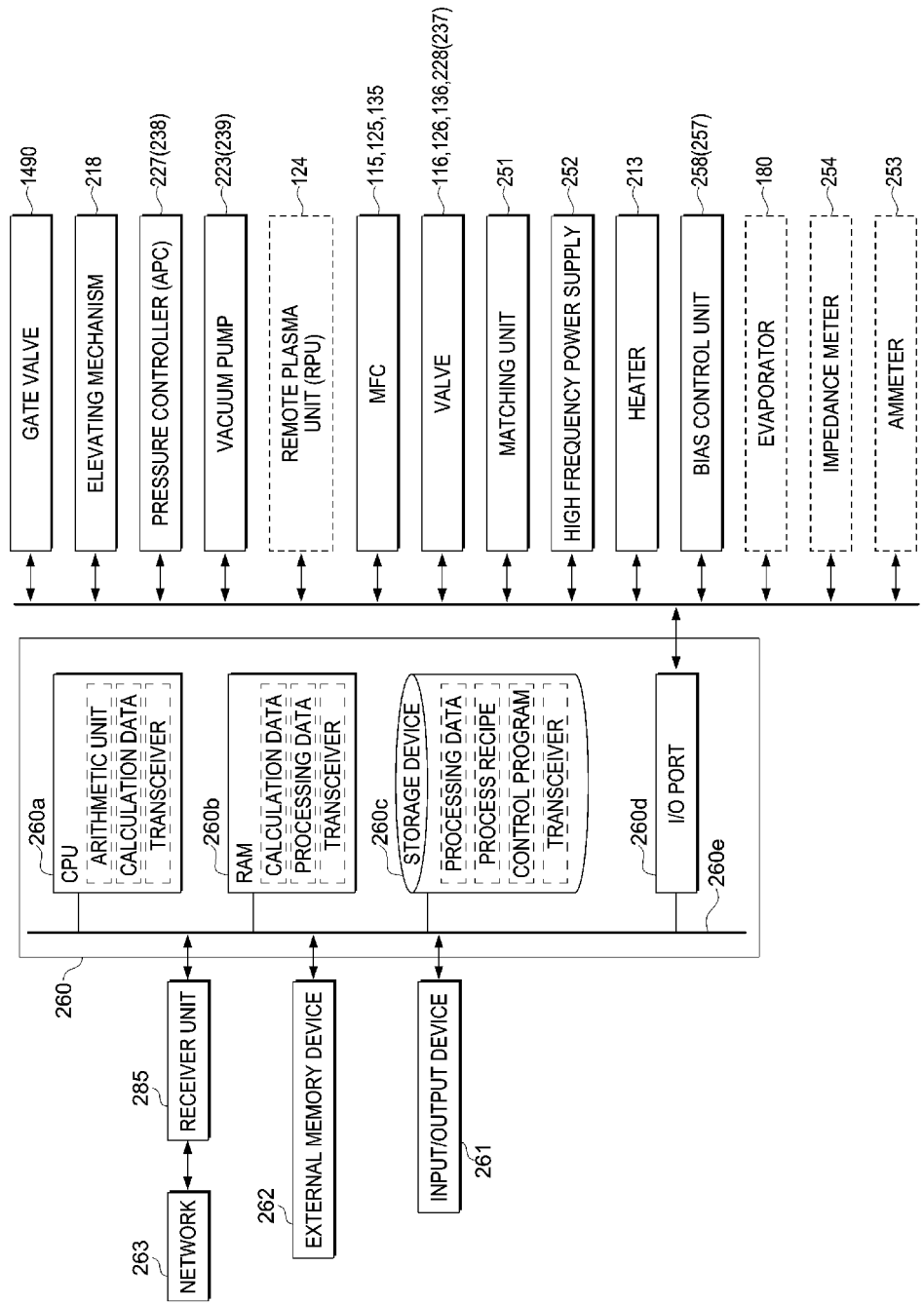
FIG. 6 schematically illustrates a configuration of a controller of a substrate processing apparatus according to the embodiment.

FIG. 6 schematically illustrates the configuration of the controller 260. The controller 260, which is the control unit, may be embodied by a computer having a CPU (Central Processing Unit) 260a, a RAM (Random Access Memory) 260b, a storage device 260c and an I/O port 260d. The RAM 260b, the storage device 260c and the I/O port 260d may exchange data with the CPU 260a via an internal bus 260e. An input/output device 261 such as a touch panel, an external memory device 262 and a receiver unit 285 may be connected to the controller 260.

The storage device 260c may be embodied by components such as flash memory and HDD (Hard Disk Drive). A control program for controlling the operation of the substrate processing apparatus; a process recipe in which information such as the order and condition of the substrate processing is stored; and calculation data and processing data generated during the processing of the wafer 200 are readably stored in the storage device 260c. The process recipe is a program that is executed in the controller 260 to obtain a predetermined result by performing sequences of the substrate processing. Hereinafter, the process recipe and the control program are collectively referred to simply as a program. The term "program" may refer to only the process recipe, only the control program, or both. The RAM 260b is a work area in which data such as the program, the calculation data and the processing data read by the CPU 260a are temporarily stored.

The I/O port 260d is connected to the gate valve 1490, the elevating mechanism 218, the heater 213, the pressure controllers 227 and 238, the vacuum pumps 223 and 239, the matching unit 251, the MFCs 115, 125 and 135, the valves 116, 126, 136, 237 and 228, the RPU 124, the evaporator 180 and the bias control units 257 and 258. The I/O port 260d may be connected to the ammeter 253 and the impedance meter 254.

The CPU 260a serving as the arithmetic unit is configured to read and execute the control program stored in the storage device 260c, and read the process recipe in accordance with an instruction such as an operation command inputted from the input/output device 260. The CPU 260a may compute the calculation data by comparing a value inputted from the receiver unit 285 with the process recipe or control data stored in the storage device 260c. The CPU 260a may select the process recipe based on the calculation data. The CPU 260a may be configured to perform the opening and closing operations of the gate valve 1490, the operation of the elevating mechanism 218, the power supply to the heater 213, operations of the pressure controllers 227 and 238, the operations of the MFCs 115, 125 and 135, the operation of the RPU 124, the operations of the valves 116, 126, 136, 237 and 228, the operation of the high frequency power supply 252, the matching operation of the matching unit 251, the operation of the high frequency power supply 252 and the operations of the bias control unit 257 and 258 according to the contents of the process recipe. The CPU 260a may be further configured to control the operations of the matching unit 251 and the high frequency power supply 252 based on the values received from the impedance meter 254 and/or the ammeter 253. When the CPU 260a controls the operations described above, a transceiver unit (transceiver) in the CPU 260a transmits/receives control information according to the process recipe.

The controller 260 may be embodied by a dedicated computer or a general purpose computer. The controller 260 of the embodiment may be embodied by preparing the external memory device 262 (e.g. magnetic tapes, magnetic disks such as flexible disk and hard disk, optical disks such as CD and DVD, magneto-optical disks such as MO, and semiconductor memories such as USB memory and memory card) and installing the program on the general purpose computer using the external memory device 262. The method of providing the program to the computer is not limited to the external memory device 262. The program may be directly provided to the computer using a communication means such as a receiver unit 285 or a network 263 (Internet or dedicated line) without the external memory device 262. The storage device 260c or the external memory device 262 may be embodied by a computer-readable recording medium. Hereinafter, the storage device 260c or the external memory device 262 may be collectively referred to as recording medium. Hereinafter, the term "recording medium" may refer to only the storage device 260c, only the external memory device 262, or both.

(2) Substrate Processing

Figure 7:
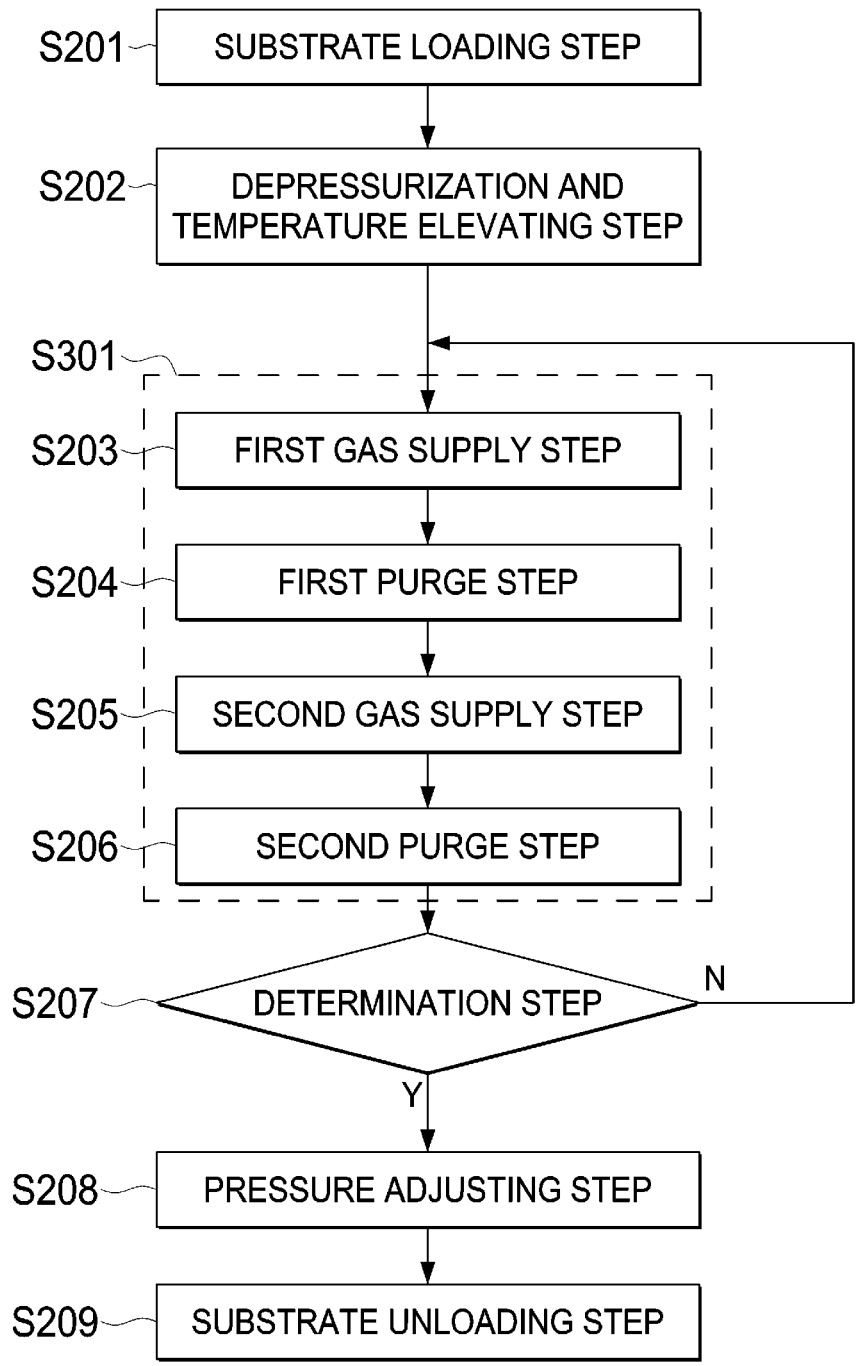
FIG. 7 is a flowchart illustrating a substrate processing according to the embodiment.

Next, a flow for forming a nitride film, a silicon nitride film (SiN film), for example, as an insulating film on a substrate, which is one of semiconductor device manufacturing processes, using the above-described substrate processing apparatus is described with reference to FIGS. 7 and 8. In the following description, the operations the components constituting the substrate processing apparatus are controlled by the controller 260.

Hereinafter, the term "wafer" refers to "wafer itself" or "stacked structure of wafer and layer or film formed on the surface thereof" (collectively to "the wafer and the layer or the film formed on the surface thereof"). "Surface of wafer" may be refers to "surface of wafer itself" or "surface of layer or film formed on the surface of wafer" (i.e. "top surface of the stacked structure").

Thus, in the specification, "supplying a predetermined gas to a wafer" refers to "directly supplying a predetermined gas to a surface (exposed surface) of the wafer itself" or "supplying a predetermined gas to a layer or film formed on a wafer" (i.e. "supplying a predetermined gas to the top surface of the stacked structure"). In the specification, "forming a predetermined layer (or film) on a wafer" refers to "forming a predetermined layer (or film) directly on the surface (exposed surface) of the wafer itself" or "forming a predetermined layer (or film) on the stacked structure" ((i.e. "forming a predetermined layer (or film) on the top surface of the stacked structure").

The term "substrate" is used in the same sense as "wafer" in the specification, and the term "wafer" may be replaced by "substrate."

Substrate Processing will be Described Hereinafter

Substrate Loading Step (S201)

In a film-forming process, the wafer 200 is loaded into the process chamber 201. Specifically, the substrate support unit 210 is lowered by the elevating mechanism 218, the lift pins 207 protrude from the upper surface of the substrate support unit 210 through the through-holes 214. After the inner pressure of the process chamber 201 or the inner pressure of the transfer chamber 203 is adjusted to a predetermined pressure, the gate valve 1490 is opened. The wafer 200 is transferred through the gate valve 1490 and placed on the lift pins 207. After the wafer 200 is placed on lift pins 207, the gate valve 1490 is closed. By elevating the substrate support unit 210 to a predetermined position by the elevating mechanism 218, the wafer 200 is transferred from the lift pins 207 to the substrate support unit 210.

Depressurization and Temperature Elevating Step (S202)

Next, the process chamber 201 is exhausted through the exhaust pipe 224 until the inner pressure of the process chamber 201 reaches a predetermined level (vacuum level). At this time, the opening degree of the pressure controller 227, which is an APC valve, is feedback-controlled based on the pressure measured by the pressure sensor (not shown). The amount of current applied to the heater 213 is feedback-controlled based on the temperature value detected by the temperature sensor (not shown) until the inner temperature of the process chamber 201 reaches a predetermined temperature. Specifically, the substrate support unit 210 is pre-heated by the heater 213 until the temperature of the wafer 200 or the temperature of the substrate support unit 210 is stable. When gas from members or moisture is present in the process chamber 201, the gas or the moisture may be removed by vacuum-exhaust or purged with N2 gas. The pre-processing step before the film-forming process is now complete. It is preferable that the process chamber 201 is exhausted to a vacuum level as much as possible until the inner pressure thereof reaches the predetermined pressure.

In this case, the temperature of the heater 213 ranges from 100° C. to 600° C., preferably from 100° C. to 500° C., more preferably from 250° C. to 450° C.

The bias adjusting unit 257 and the bias electrode 256 may adjust the electric potential of the wafer 200 may be adjusted such that the electric potential of the wafer 200 is at a predetermined level.

Film-forming Step (S301)

Hereinafter, an example of forming an SiN film on the wafer 200 will be described. The film-forming step S301 will be described in detail with reference to FIG. 7 and FIG. 8.

When the wafer 200 is placed on the substrate support unit 210, and 예 the inner atmosphere of process chamber 201 is stabilized, steps S203 through S207 described below are performed.

First Gas Supply Step (S203)

In the first gas supply step S203, a dichlorosilane ($SiH_2Cl_2$: DCS gas), which is the first gas (process gas), is supplied into the process chamber 201 by the first gas supply system. Specifically, the DCS gas having the flow rate thereof adjusted by the MFC 115 is supplied from the first gas supply source 113 to the substrate processing apparatus 100. The DCS gas having the flow rate thereof adjusted is then supplied to the depressurized process chamber 201 through the buffer chamber 232 and the second hole 234a of the shower head 234. The exhaust system continuously exhausts the process chamber 201 such that the inner pressure of process chamber 201 is maintained at a predetermined pressure. At this time, the DCS gas is supplied to the wafer 200 in the process chamber 201 at a predetermined pressure first pressure ranging from 10 Pa to 1000 Pa for example. By supplying the DCS gas to the wafer 200, a silicon-containing layer is formed on the wafer 200. In the embodiment, the silicon-containing layer refers to a layer including silicon (Si) or a layer including silicon and chlorine (Cl).

First Purge Step (S204)

After the silicon-containing layer is formed on the wafer 200, the gas valve 116 at the gas supply pipe 150 is closed to stop the supply of the DCS gas. The first purge step S204 is performed by stopping the supply of the DCS gas (first gas) and exhausting the first gas present in the process chamber 201 or the process gas present in the buffer chamber 232 by first exhaust unit.

In the purge step, the remaining gas may be extruded by further supplying an inert gas in addition to exhausting the gas by the vacuum exhaust. That is, the vacuum exhaust may be combined with the supply of the inert gas. In the alternative, the vacuum exhaust and the supply of the inert gas may alternatively be performed.

At the same time, the gas present in the buffer chamber 232 may be exhausted by the vacuum pump 239 via the exhaust pipe 236 by opening the valve 237 at the exhaust pipe 236.

After a predetermined time elapses, the supply of the inert gas is stopped by closing the valve 136, and the buffer chamber 232 is disconnected from the vacuum pump 239 by closing the valve 237. However, the inert gas may be continuously supplied by maintaining the valve 136 open. By continuously supplying the inert gas into the buffer chamber 232, gases used in other steps may be prevented from entering the buffer chamber 232.

The temperature of the heater 213 may be set to be equal to that of the temperature of the heater 213 when the first gas supplied to the wafer 200. Preferably, the flow rate of $N_2$ gas, which is a purge gas supplied by the inert gas supply system, ranges from 100 sccm to 20000 sccm. Rare gases such as argon (Ar), helium (He), neon (Ne) and xenon (Xe) may be used as the purge gas as well as $N_2$ gas.

Second Gas Supply Step (S205)

By opening After first purge step S204, the valve 126 is opened to supply ammonia gas ($NH_3$), which is the second gas (process gas), into the process chamber 201 via the gas introduction hole 241, the buffer chamber 232 and the second hole 234a. The second gas is also referred to as process gas for processing the wafer 200, or a reactive gas which reacts with the first gas, the silicon-containing layer and the wafer 200.

At this time, the MFC 125 adjusts the flow rate of the $NH_3$ gas to a predetermined value. For example, the flow rate of $NH_3$ gas ranges from 100 sccm to 10000 sccm.

The high frequency power is supplied from the high frequency power supply 252 to the electrode 243 via the matching unit 251. By supplying the high frequency power to the electrode 243, a plasma of the second gas (active species of the second gas) is generated in the second hole 234a. When the activated $NH_3$ is supplied to the silicon-containing layer formed on the wafer 200, the silicon-containing layer is modified to a layer containing silicon and nitrogen.

Figure 8:
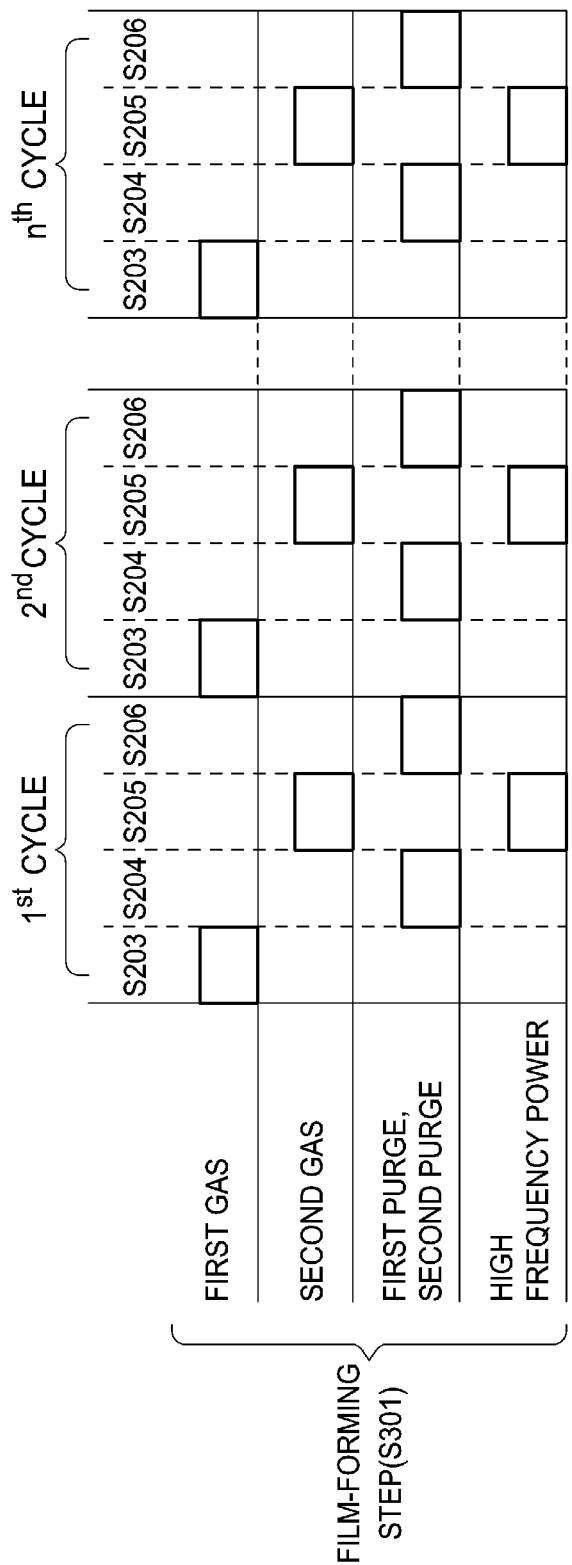
FIG. 8 exemplifies a sequence of a substrate processing according to the embodiment.

While FIG. 8 illustrates an example wherein the high frequency power is applied simultaneously with the supply of the second gas, the high frequency power may be supplied before supply of the second gas. The high frequency power may also be continuously applied from the start of the first gas supply step S203 to the end of determination step S207. When the high frequency power is continuously applied, a plasma of the second gas may be formed.

The bias adjusting unit 257 may adjust the electric potential of bias electrode 256 provided in the substrate support 212 to control the amount of charge particles supplied to the wafer 200.

A modified layer having a predetermined thickness, a predetermined distribution, a predetermined intrusion depth of nitrogen component is formed depending on the conditions such as the inner pressure of the process chamber 201, the flow rate of the NH$_3$ gas, the temperature of the wafer 200 and the electric power of the high frequency power supply 252.

After a predetermined time elapses, the valve 126 is closed to stop the supply of NH$_3$ gas.

At this time, the temperature of the heater 213 is set to be equal to that of the temperature of the heater 213 when the first gas supplied to the wafer 200.

The processing uniformity may be improved by supplying the NH$_3$ gas activated by the RPU 124 to the buffer chamber 232.

Second Purge Step (S206)

The second purge step S206 same as the first purge step S204 is performed. For example, the supply of NH$_3$ gas is stopped and the NH$_3$ gas present in the process chamber 201 or the NH$_3$ gas present in the buffer chamber 232 is exhausted by first exhaust unit. Purge is performed by supplying a purge gas into the buffer chamber 232 and the process chamber 201.

Determination Step (S207)

After the second purge step S206 is complete, the controller 260 determines whether the film-forming step S301 including the step S203 through the step S206 is performed a predetermined number of times. That is, the controller 260 determines whether a film having a desired thickness is formed on the wafer 200. The film (SiN film) having the desired thickness may be formed by performing the cycle including the step S203 through the step S206 at least once. It is preferable that the cycle is performed multiple times to form the SiN film having a desired thickness on the wafer 200.

When the controller 260 determines, in the determination step S207, that the film-forming step S301 is not performed the predetermined number of times ("N" in FIG. 7), the film-forming step S301 is repeated. When the controller 260 determines, in the determination step S207, that the film-forming step S301 is performed the predetermined number of times ("Y" in FIG. 7), the film-forming step S301 is terminated. After performing the pressure adjusting step S208, the substrate unloading step S209 is performed to complete the substrate processing.

The inventors of the present invention conducted extensive research and found that there were the following problems.

When the steps S203 through S206 are repeated multiple times, the plasma generated in the second hole 234a and/or the process chamber 201 varies and the uniformity of wafer processing is degraded. The uniformity refers to, for example, the uniformity of the thickness of the film on the wafer 200 or the uniformity between the plurality of wafers 200 processed in one batch.

As a result of extensive researches on the above-described problems, it has been confirmed that the above-described problems may be solved by the method described below. By monitoring the state of the plasma using the impedance meter 254 and/or the ammeter 253 shown in FIG. 1, data including an impedance value or current value varying according to the state of the plasma may be obtained. By controlling the high frequency power supplied to the electrode 243 and the bias of the bias control unit 258 connected to the dispersion plate 234d based on the data, the degradation of the uniformity may be suppressed.

Figure 9:
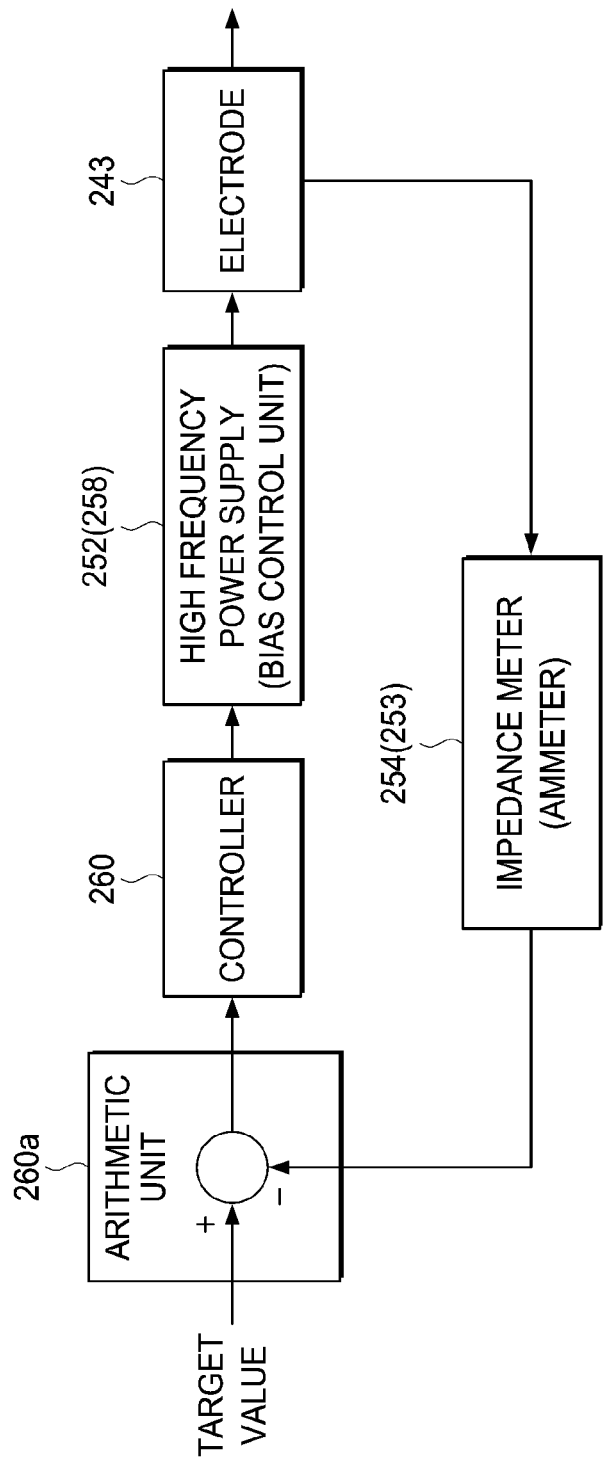
FIG. 9 is a block diagram of a feedback control system for controlling an amount of generated plasma according to the embodiment.

An example of the feedback control will be described in detail with reference to FIG. 9. FIG. 9 is a block diagram schematically illustrating a control system for controlling amount of plasma. The control system shown in FIG. 9 includes arithmetic unit of CPU 260a, controller 260, high frequency power supply 252 (bias control unit 258), electrode 243 and impedance meter 254 (ammeter 253). The target value stored in the storage medium is read before the second gas supply step S205 starts, and the controller 260 sets, based on the target value, the amount of electric power which is to be supplied by the high frequency power supply 252 or the bias control unit 258. When plasma is generated in the second gas supply step S205, at least one of an impedance of the electrode and a current flowing through the electrode varies according to the amount of plasma generated. The varying impedance or current corresponds to the amount of plasma generated. The impedance meter 254 or the ammeter 253 measures the impedance or the current and transmits the measured impedance value or the current value corresponding to the amount of plasma to the CPU 260a. The CPU 260a calculates the difference between the target value and the impedance value or target value and the current value, and the controller 260 controls the high frequency power supply 252 or the bias control unit 258 based on the difference to adjust the electric power applied to the electrode, thereby improving the uniformity of the wafer processing.

Although the embodiments of the above-described techniques have been specifically described, the above-described techniques are not limited to the above-described embodiments, and may be variously modified without departing from the gist of the present invention. Other forms of the above-described technique will be described with reference to FIGS. 10A through 10C. FIGS. 10A through 10C illustrate a second example of the electrode 243.

FIG. 10A illustrates: the insulating plate 244 disposed on the dispersion plate 234d and provided with hole 244b having a diameter the same as that of the second hole 234a and communicating with the second hole 234a; and the electrode 243 disposed on the insulating plate 244 and defining a gas flow channel 245 for supplying gas. By supplying the process gas through the gas flow channel 245, the hole 244b and the second hole 234a, the conductance from the gas supply system to the process chamber 201 may be improved, and the amount of gas supplied to the wafer 200 may be increased. According to the configuration shown in FIG. 2A, the gas flow channel 243a and the first hole 244a should be in-line. However, according to the configuration shown in FIG. 10A, the gas flow channel 243a and the first hole 244a is not required to be in-line. Therefore, according to the configuration shown in FIG. 10A, the manufacturing of the shower head 243 may be facilitated, and the uniformity between substrate processing apparatuses may be improved. The maintenance of the substrate processing apparatus is also facilitated.

While the configuration shown in FIG. 10B is similar to the configuration shown in FIG. 10A, the configuration shown in FIG. 10B differs from the configuration shown in FIG. 10A in that a protrusion 246b is provided in the electrode 243. As shown in FIG. 10B, the surface area of electrode 243 is increased by the protrusion 246b. As a result, the amount of the active species generated in the second hole 234a may be increased. The protrusion may be cylindrical, spherical or hemispherical.

The configuration shown in FIG. 10C differs from the configuration shown in FIG. 10B in that a protrusion 246c extends into the second hole 234a. By extending the protrusion 246c into the second hole 234a, the surface area of the electrode 243 is further increased. As a result, the amount of the active species generated in the second hole 234a may be further increased. As shown in FIG. 10C, the lower end of the protrusion 246c is higher than the lower end 234f of the second hole 234a by a height H. The height H is greater than the diameter D1 of the second hole 234a. In this configuration, the amount of the ion component captured by the inner wall 234e electrically grounded can be set to be greater than that of the ion component ejected from the second hole 234a while increasing the amount of the active species generated in the second hole 234a. As a result the amount of the ion component supplied to the wafer 200 may be reduced.

While an embodiment wherein the first gas and the second gas are alternately supplied to form a film is exemplified above, the above-described technique may be applied to other methods. For example, the above-described technique may be applied even when the supply of the first gas and the supply of the second gas partially overlap.

While an embodiment wherein two different gases are supplied to process the wafer, the above-described technique can also be applied to wafer processing wherein one type of gas is supplied.

While a film-forming process is exemplified above, the above-described technique may be applied to other processes. For example, the above-described technique may also be applied to diffusion process, oxidation process, nitridation process, oxynitridation process, reduction process, oxidation-reduction process, etching process and heating process using plasma. The above-described technique may also be applied to plasma oxidation or plasma nitridation of a film formed on a substrate using only a reaction gas. The above-described technique may also be applied to the plasma annealing process using only the reaction gas.

While the manufacturing process of a semiconductor device is exemplified above, the above-described techniques may be applied to other manufacturing processes. For example, the above-described techniques may be applied to a manufacturing process of a liquid crystal device, a manufacturing process of a solar cell, a manufacturing process of a light emitting device, a manufacturing process of a glass substrate, a manufacturing process of a ceramic substrate and a manufacturing process of a conductive substrate.

While an embodiment wherein a silicon nitride film is formed using a silicon-containing gas as a raw gas and a nitrogen-containing gas as a reaction gas, the above-described techniques may be applied to methods for forming other films using different gases. For example, the above-described technique may also be applied to a formation of an oxygen-containing film, a formation of a nitrogen-containing film, a formation of a carbon-containing film, a formation of a boron-containing film and a formation of a metal-containing film and a formation of a film containing at least two of these elements. The above-described technique may also be applied to a formation of AlO film, ZrO film, HfO film, HfAlO film, ZrAlO film, SiC film, SiCN film, SiBN film, TiN film, TiC film and TiAlC film.

While a substrate processing apparatus capable of that processing one substrate in one process chamber is exemplified above, the above-described techniques are not limited thereto and may be applied to other substrate processing apparatuses. For example, the above-described technique may also be applied to a substrate processing apparatus capable of processing a plurality of substrates arranged horizontally or vertically.

According to the technique described herein, the effects of the plasma on the film or structure formed on the substrate may be suppressed.

What is claimed is:

1. A substrate processing apparatus comprising:
    a process chamber where a substrate is processed;
    a substrate support unit configured to support the substrate;
    a gas supply unit configured to supply a gas to the substrate via a buffer chamber;
    an electrode comprising a protrusion, wherein a gas flow channel in communication with the buffer chamber is provided in the protrusion, the gas flow channel is configured to supply the gas to the process chamber, and the electrode is disposed under the buffer chamber;
    an insulating plate comprising a first hole provided adjacent to the gas flow channel, wherein the insulating plate is disposed under the electrode, and the protrusion is inserted in the first hole;
    a dispersion unit comprising a second hole disposed adjacent to the first hole to be in communication with the gas flow channel, wherein the dispersion unit is disposed under the insulating plate, the protrusion is inserted in the second hole, and a distance between a front end of the protrusion and a lower end of the second hole is greater than a diameter of the second hole;
    a power supply unit electrically connected to the electrode; and
    a control unit configured to: control the gas supply unit to supply the gas into a plasma generation region in the second hole at a downstream side of the insulating plate; and control the power supply unit to supply electrical power to the electrode to generate a plasma of the gas in the plasma generation region.

2. The substrate processing apparatus of claim 1, wherein the dispersion unit is electrically grounded, and the plasma generation region in the second hole is provided adjacent to the insulating plate.

3. The substrate processing apparatus of claim 1, wherein a diameter of the first hole is smaller than that of the second hole.

4. The substrate processing apparatus of claim 2, wherein a diameter of the first hole is smaller than that of the second hole.

5. The substrate processing apparatus of claim 1, wherein the protrusion comprises a third hole at a side surface thereof facing an inner wall of the second hole.

6. The substrate processing apparatus of claim 2, wherein the protrusion comprises a third hole at a side surface thereof facing an inner wall of the second hole.

7. The substrate processing apparatus of claim 3, wherein the protrusion comprises a third hole at a side surface thereof facing an inner wall of the second hole.

8. The substrate processing apparatus of claim 4, wherein the protrusion comprises a third hole at a side surface thereof facing an inner wall of the second hole.

9. The substrate processing apparatus of claim 1, further comprising a sensor disposed between the electrode and the power supply unit, wherein the sensor is configured to measure an impedance or a current.

10. The substrate processing apparatus of claim 1, further comprising:
    a bias electrode provided in the substrate support unit; and
    a bias adjusting unit connected to the bias electrode.

11. The substrate processing apparatus of claim 1, wherein the protrusion has a cylindrical shape.

12. The substrate processing apparatus of claim 11, wherein the front end of the protrusion has a spherical shape or a hemispherical shape.

13. The substrate processing apparatus of claim 1, wherein the front end of the protrusion has a spherical shape or a hemispherical shape.

14. The substrate processing apparatus of claim 1, wherein a gas flow channel configured to supply the gas into the second hole is provided between the electrode and the insulating plate.

15. The substrate processing apparatus of claim 1, wherein the process chamber comprises a gas introduction hole provided at a sidewall thereof.

16. The substrate processing apparatus of claim 2, further comprising:
   a bias electrode provided in the substrate support unit; and
   a bias adjusting unit connected to the bias electrode.

17. The substrate processing apparatus of claim 5, wherein the front end of the protrusion has a spherical shape or a hemispherical shape.

* * * * *